(12) United States Patent
Nishimura

(10) Patent No.: US 8,188,769 B2
(45) Date of Patent: May 29, 2012

(54) METHOD AND APPARATUS FOR PROPAGATION DELAY AND EMI CONTROL

(75) Inventor: Naoaki Nishimura, Funabashi (JP)

(73) Assignee: Analog Devices, Inc., Norwood, MA (US)

( * ) Notice: Subject to any disclaimer, the term of this patent is extended or adjusted under 35 U.S.C. 154(b) by 13 days.

(21) Appl. No.: 12/432,654

(22) Filed: Apr. 29, 2009

(65) Prior Publication Data

US 2009/0278589 A1    Nov. 12, 2009

Related U.S. Application Data

(60) Provisional application No. 61/051,727, filed on May 9, 2008.

(51) Int. Cl.
*H03K 3/00* (2006.01)
(52) U.S. Cl. .............................. 327/108; 327/170; 326/83
(58) Field of Classification Search .................. 327/108, 327/170; 326/83
See application file for complete search history.

(56) References Cited

U.S. PATENT DOCUMENTS

| | | | | |
|---|---|---|---|---|
| 4,628,218 A * | 12/1986 | Nakaizumi | ...................... | 326/33 |
| 4,959,561 A | 9/1990 | McDermott et al. | | |
| 5,010,256 A * | 4/1991 | Dicke | ........................... | 327/322 |
| 5,361,003 A * | 11/1994 | Roberts | ........................... | 326/21 |
| 5,594,361 A * | 1/1997 | Campbell | ........................ | 326/24 |
| 5,781,045 A * | 7/1998 | Walia et al. | .................... | 327/108 |
| 6,091,260 A | 7/2000 | Shamarao | | |
| 6,094,086 A | 7/2000 | Chow | | |
| 6,300,788 B1 * | 10/2001 | Sher et al. | ........................ | 326/21 |
| 6,320,432 B1 * | 11/2001 | Nagao | ........................... | 327/108 |
| 6,388,488 B1 * | 5/2002 | Ho | ................................. | 327/206 |
| 6,411,150 B1 * | 6/2002 | Williams | ........................ | 327/281 |
| 6,515,503 B2 * | 2/2003 | Griffin et al. | .................... | 326/30 |
| 6,559,676 B1 * | 5/2003 | Tomita | ............................ | 326/81 |
| 6,670,822 B2 * | 12/2003 | Freitas | ............................ | 326/34 |
| 7,126,389 B1 * | 10/2006 | McRae et al. | .................. | 327/112 |
| 7,190,225 B2 | 3/2007 | Edwards | | |

OTHER PUBLICATIONS

Alfio Consoli, Salvatore Musumeci, Giovanna Oriti and Antonio Testa, "An Innovative EMI Reduction Design Technique in Power Converters", IEEE Transactions on Electromagnetic Compatibility, vol. 38, No. 4, Nov. 1996.

* cited by examiner

*Primary Examiner* — Kenneth B. Wells
(74) *Attorney, Agent, or Firm* — Kenyon & Kenyon LLP

(57) ABSTRACT

An output switch driving capability booster which may effectively reduce a propagation delay in an output switch with an independently controllable output transition change rate. A delay controller coupled to the output switch may be used to control the propagation delay. The delay controller may have a switch which may be switched on and off approximately simultaneously with the output switch, and a resistance device which may be adjusted to reduce the propagation delay.

14 Claims, 8 Drawing Sheets

401

METHOD AND APPARATUS FOR PROPAGATION DELAY AND EMI CONTROL

CROSS REFERENCE TO RELATED APPLICATION

This application claims the benefit of priority to previously filed U.S. provisional patent application Ser. No. 61/051,727, filed May 9, 2008, entitled DYNAMIC SWITCHING EDGE SPEED CONTROL CIRCUIT TO REDUCE EMI AND PROPAGATION DELAY. That provisional application is hereby incorporated by reference in its entirety.

BACKGROUND INFORMATION

The present invention relates generally to driver circuits for output switches, and more specifically to driver circuits with better Electro-Magnetic Interference (EMI) and propagation delay control.

An output switch may be used to provide a switching output voltage in response to a control signal from its driver circuit. Usually, a short propagation delay, the delay from the time of a control signal change to the time of a corresponding output voltage change, is preferred, since it is good for the stability of a circuit using the output voltage. At the same time, a slow transition on the output voltage may generate less EMI and thus is preferable. Prior art driver circuits for output switches have either a short propagation delay or a slow transition on the output voltage, but not both.

FIG. 1 illustrates a prior art driver circuit for an N-type output switch mn3. The driver is inverter based and has a pair of complementary field-effect transistors (FETs): a P-type FET mp0 and an N-type FET mn0. Their gates are coupled to an input switching voltage $V_{in}$, and their drains are coupled together. A power supply $V_{DD}$ is applied to the source of mp0, and the source of mn0 is grounded. The voltage at the drains of mp0 and mn0 is used to drive an output switch mn3, being applied to the gate of mn3 as $V_g$. The source of the output switch mn3 is grounded and an output voltage $V_{out}$ is obtained from the drain of mn3. The threshold voltage of mn3 is $V_{TH}$, and $V_{TH} < V_{DD}$.

FIG. 2 illustrates waveforms of $V_{in}$, $V_g$ and $V_{out}$ in the driver circuit of FIG. 1 during a process of turning off the output switch mn3. When the input voltage $V_{in}$ is low, mp0 is conductive, mn0 is not conductive and $V_g \approx V_{DD}$. Consequently, mn3 is conductive, and $V_{out}$ is low. When the input voltage $V_{in}$ turns high, mp0 will stop being conductive when $V_{in}$ reaches its threshold voltage, and mn0 will become conductive when $V_{in}$ reaches its threshold voltage. When mn0 is conductive, it may pull down $V_g$. When $V_g$ drops below $V_{TH}$, the threshold voltage of mn3, the conductivity of mn3 reduces and $V_{out}$ starts the transition from low to high.

A propagation delay is measured from the $V_{in}$ change to the point at which the transition of the output voltage $V_{out}$ starts. The propagation delay may be controlled by the strength of the driver, or mn0 more specifically, because the stronger the driving strength of mn0, the faster the $V_g$ may be pulled down, and the shorter the propagation delay. FIG. 2 illustrates waveforms of $V_{in}$, $V_g$, and $V_{out}$ when a mn0 with a strong driving strength is used, and FIG. 3 illustrates waveforms of these signals when a mn0 with a weak driving strength is used. As shown, when a mn0 with a strong driving strength is used, the propagation delay is short; but the transition on $V_{out}$ is fast, resulting in more EMI. On the contrary, when a mn0 with a weak driving strength is used, the transition on $V_{out}$ is slower, which is good for EMI performance, but the propagation delay is very long.

Adjusting mn0 current sink capability may change the output transition change rate, but it may affect the propagation delay as well.

Therefore, it would be desirable to provide a driver for an output switch, which has a short propagation delay and a slow transition on the output voltage of the output switch.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

DETAILED DESCRIPTION

Embodiments of the present invention provide an output switch having a driving capability booster which may work just before a switching transition happens. The booster may effectively reduce the propagation delay in the output switch with an independently controllable output transition change rate. Embodiments may include a delay controller coupled to the output switch. The delay controller may have a switch whose conductivity may change approximately simultaneously with the output switch, and a resistance device which may be adjusted to reduce the propagation delay without affecting the output transition change rate. The booster may be used in class-D applications (e.g., switching amplifiers in which switches are either fully on or fully off to improve power efficiency), power management integrated circuits (ICs) having a switching output stage, or any high speed switching design with EMI concerns.

Figure 4:
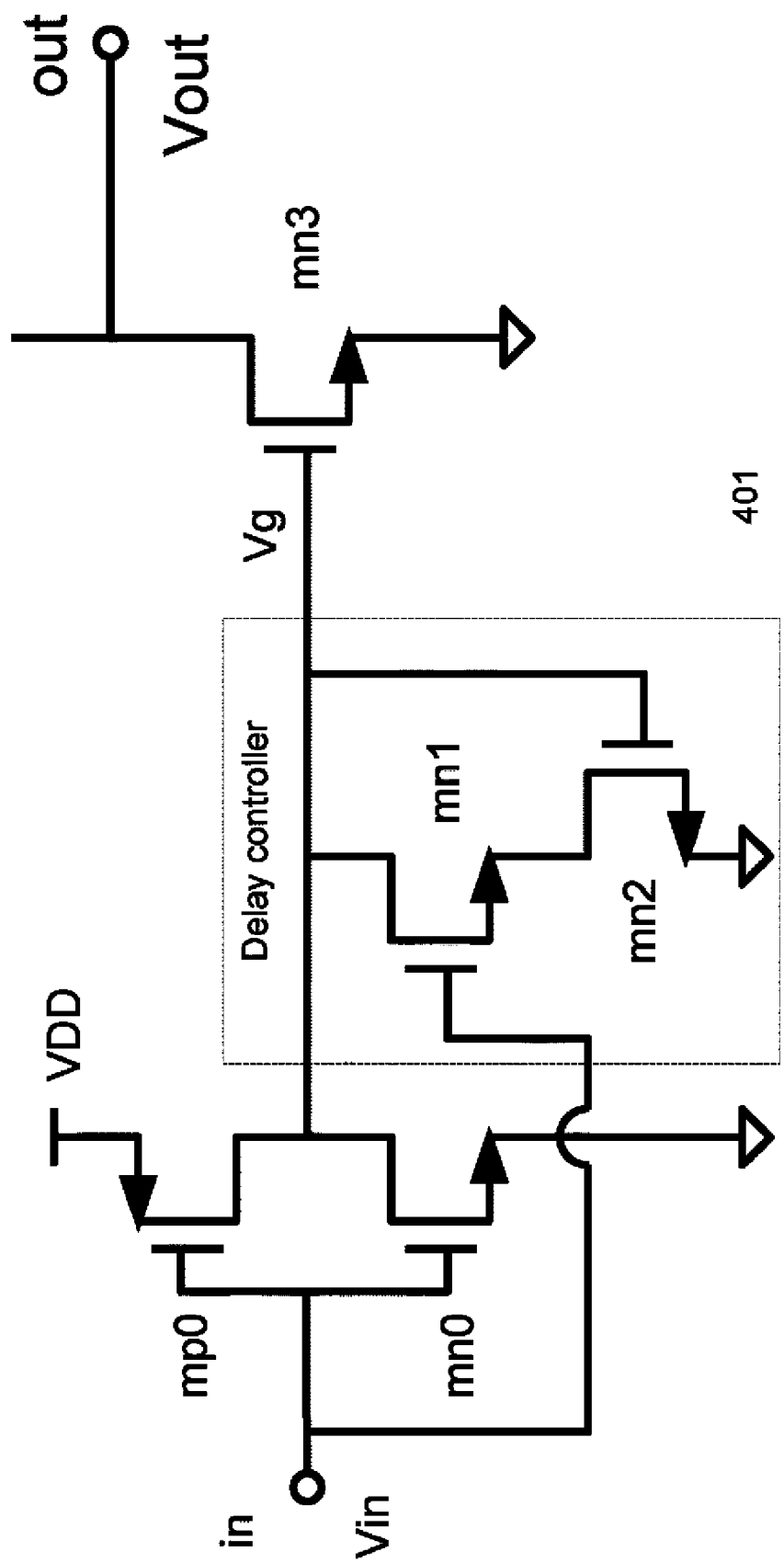
FIG. 4 illustrates a driver circuit for an output switch according to one embodiment of the present invention.

FIG. 4 illustrates a driver circuit of an output switch according to one embodiment of the present invention. A delay controller 401 may be added to the circuit in FIG. 1 to control the propagation delay, which again may be measured from the time of $V_{in}$ change to the time of $V_{out}$ transition. The delay controller 401 may include transistors mn1 and mn2. The transistor mn1 may have its gate coupled to the input voltage $V_{in}$, its drain coupled to the gate of the output switch mn3 and its source coupled to the drain of the transistor mn2, respectively. The transistor mn2 may have its gate coupled to the gate of the output switch mn3, its drain coupled to the source of mn1 and its source coupled to the ground, respectively. The transistor mn2 may be the same type of device as the output switch mn3, in this case an N-type FET, or alternatively may have similar transition properties as the output switch mn3, so that their transitions may happen approximately simultaneously. Transistors mn1 and mn0 need not to be similar to each other and may have different threshold voltages.

Figure 5:
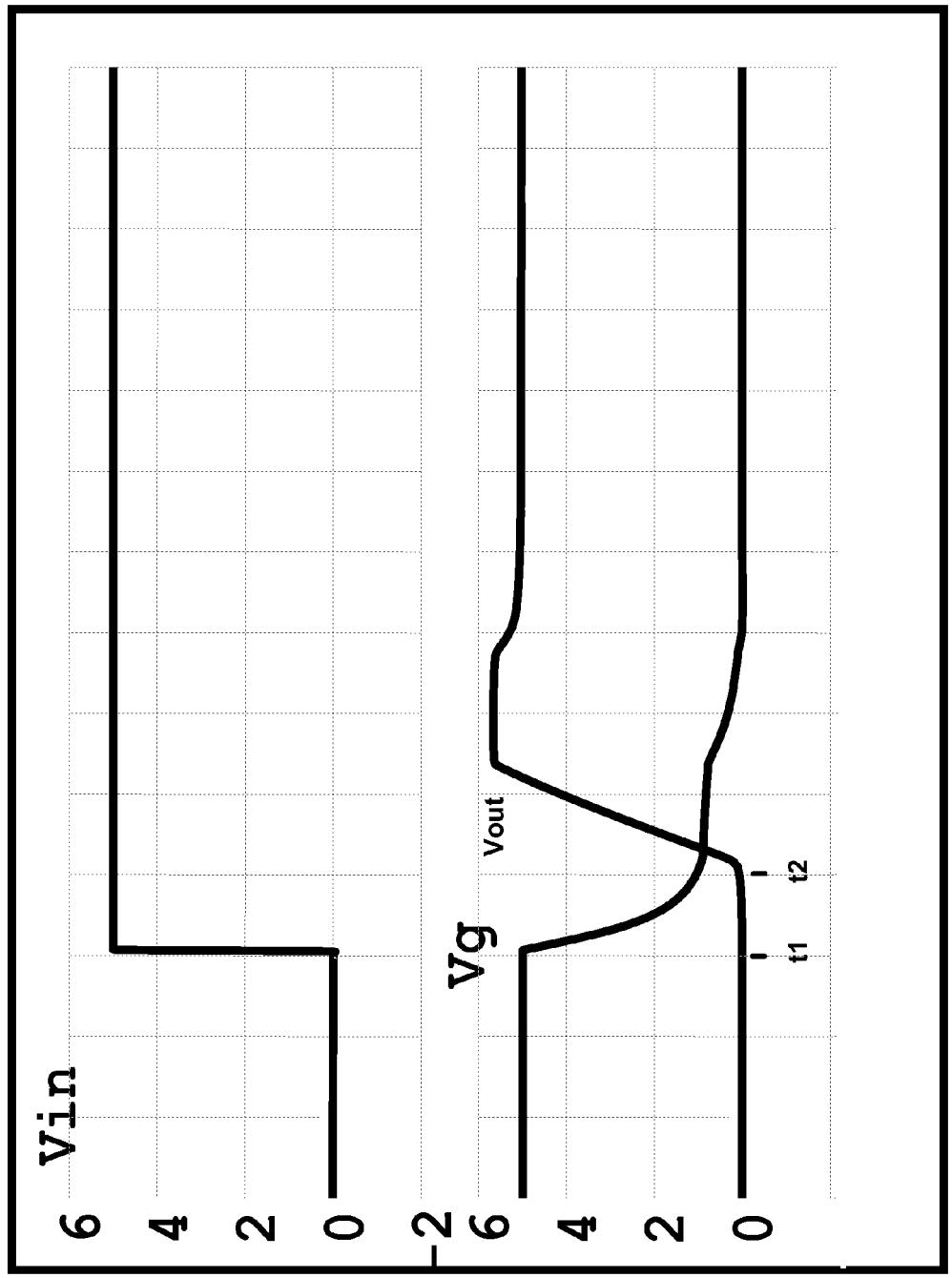
FIG. 5 illustrates waveforms of signals in the driver circuit of FIG. 4 during a process of turning off the output switch according to one embodiment of the present invention.

FIG. 5 illustrates waveforms of signals in the driver circuit of FIG. 4 during a process of turning off the output switch mn3. As shown, before time t1, the input voltage $V_{in}$ may be low, mp0 may be conductive, mn0 and mn1 may not be conductive, and $V_g \approx V_{DD}$. Since $V_{DD}$ is higher than the threshold voltage $V_{TH}$ of mn3, and that of mn2 too, mn3 and mn2 may be conductive, and $V_{out}$ may be low.

Around time t1, the input voltage $V_{in}$ may turn high, mp0 may stop being conductive when $V_{in}$ exceeds its threshold voltage, and mn0 and mn1 may become conductive when $V_{in}$ reaches their threshold voltages respectively. When mn0 becomes conductive, it may pull $V_g$ below $V_{TH}$. Before $V_g$ drops below the threshold voltage $V_{TH}$ of mn3 and mn2, both mn1 and mn2 are conductive, the circuit branch consisting of mn1 and mn2 may accelerate the pull down effect applied to $V_g$. The resistance of mn1 and/or mn2 may be adjusted to accelerate the drop of $V_g$: the lower the total resistance of the circuit branch consisting of mn1 and mn2, the faster $V_g$ may be pulled down, the earlier mn3 may stop being conductive, and the earlier the transition of $V_{out}$ may start. Thus, this may help to reduce the propagation delay between the time of $V_{in}$ change and the time of $V_{out}$ transition.

Shortly after time t2, $V_g$ may drop below the threshold voltage $V_{TH}$ of mn3 and mn2. Transistors mn3 and mn2 may stop being conductive, and the $V_{out}$ transition, from low to high, may start.

In the circuit in FIG. 4, when the output switch mn3 is not conductive, mn2 in the delay controller 401 is not conductive either, since they have similar $V_{TH}$ and their gates are coupled together. Accordingly, the delay controller 401 may be operative to pull down $V_g$ only when both mn3 and mn2 are conductive, which is before the output transition, thus avoiding affecting the output transition change rate. As a result, the driving strength of mn0 may be selected solely for the output transition change rate, instead of a balance between the output transition change rate and the propagation delay.

When the propagation delay is adjusted by changing the series resistance of mn1 and mn2, the adjustment may be independent of the driving strength of the driver, the output transition change rate, and so the EMI performance of the output switch mn3. The transistor mn1 may be another type of resistance device, e.g., a resistor, a variable resistor or a potentiometer. The benefits of using a transistor is that it is conductive only when it is needed to accelerate the change of the voltage $V_g$, which minimizes power consumption when the delay controller 401 is not operative.

Figure 1:
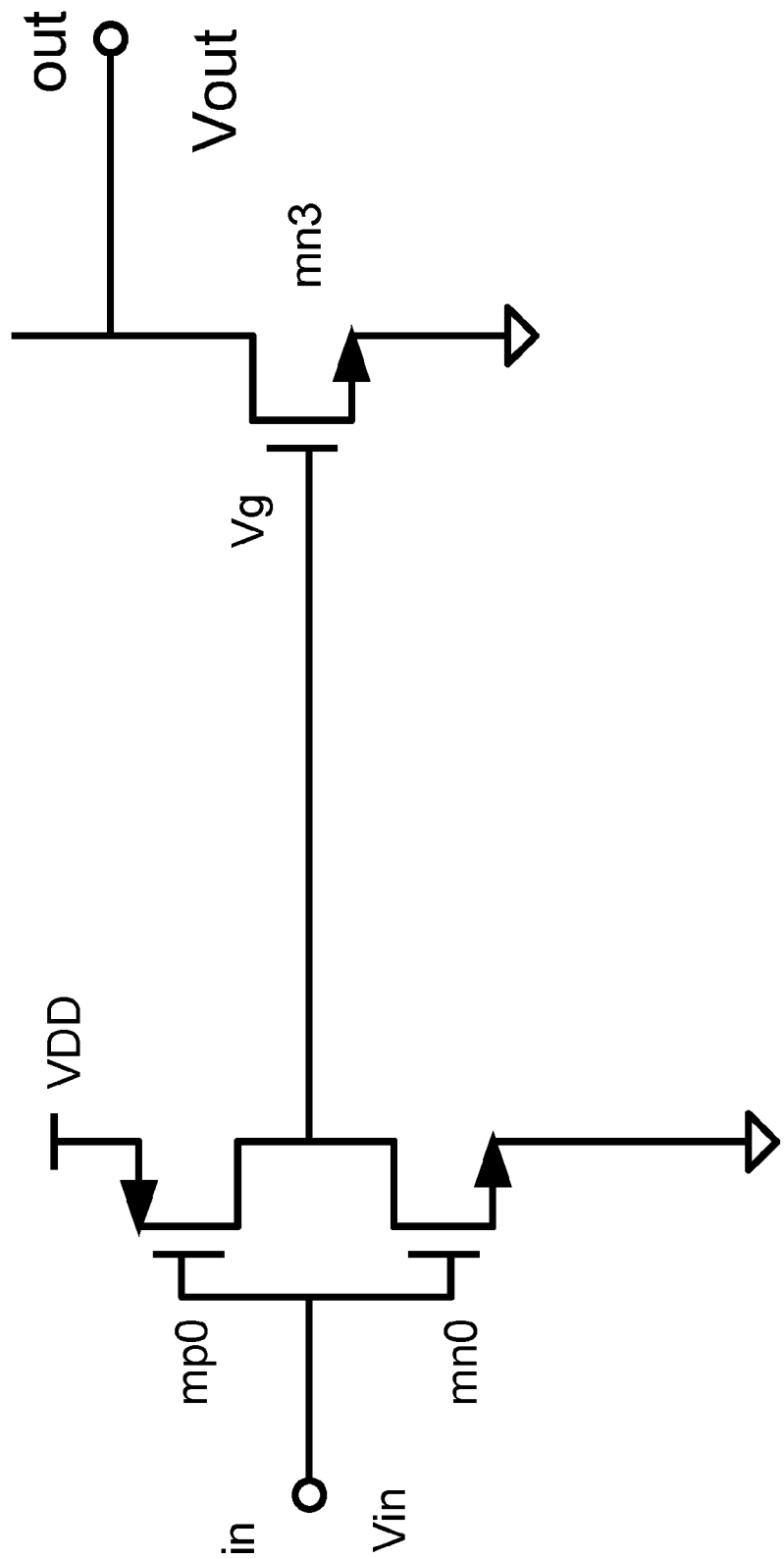
FIG. 1 illustrates a prior art driver circuit for an output switch.
Figure 2:
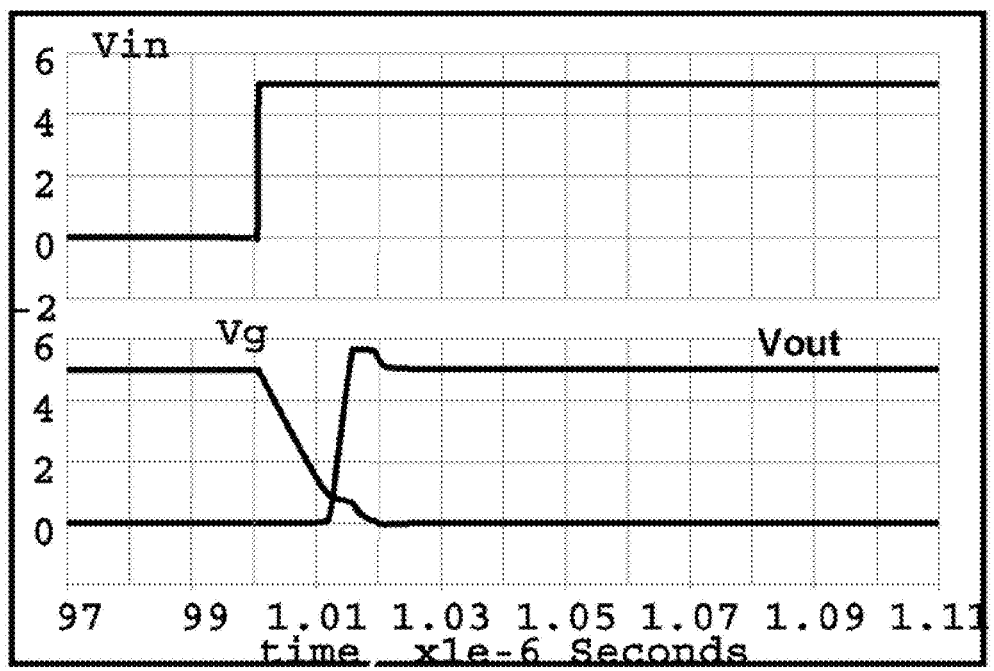
FIG. 2 illustrates waveforms of signals in the circuit of FIG. 1 during a process of turning off the output switch when a strong driver circuit is used.
Figure 3:
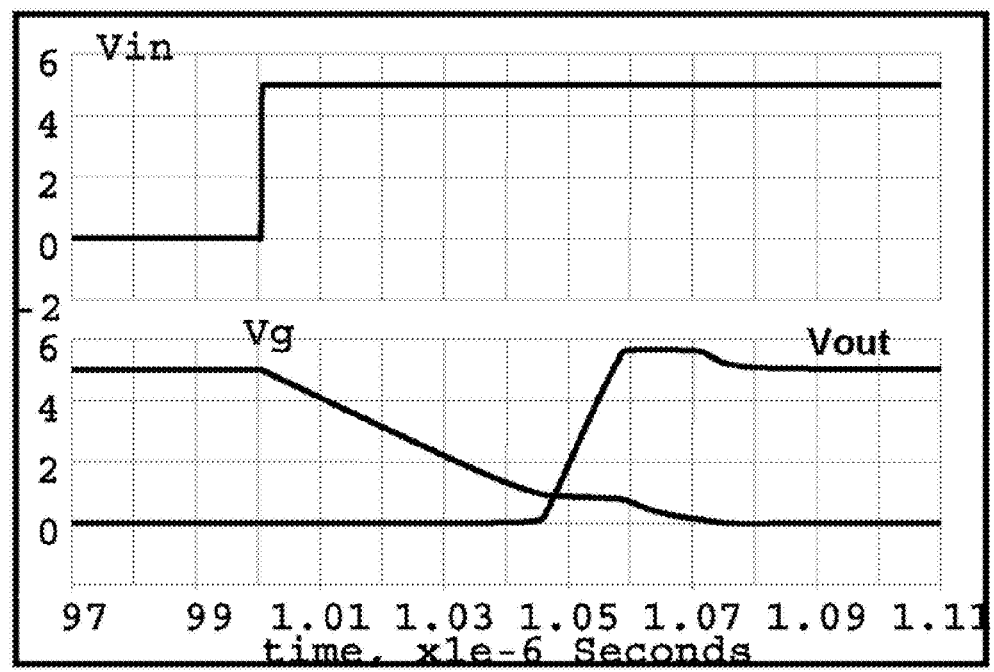
FIG. 3 illustrates waveforms of signals in the circuit of FIG. 1 during a process of turning off the output switch when a weak driver circuit is used.

As shown in FIGS. 2, 3 and 5, the circuit of FIG. 4 may have the preferable short propagation delay of FIG. 2 achieved by using a mn0 with a strong driving strength in the prior art circuit in FIG. 1, and the preferable slow output transition change rate of FIG. 3 achieved by using a mn0 with a weak driving strength in the circuit of FIG. 1, since its propagation delay may be adjusted independently of its output transition change rate.

Although an N-type FET output switch mn3 is used as an example in the circuit in FIG. 4, the principle of the invention may be used for other kinds of output switches, such as a P-type FET, a bipolar junction transistor (BJT), and an insulated gate bipolar transistor (IGBT). In such circumstances, the delay controller should be configured to turn on and off approximately simultaneously with the output switch. More embodiments of the delay controller of the present invention will be described below.

Figure 6A:
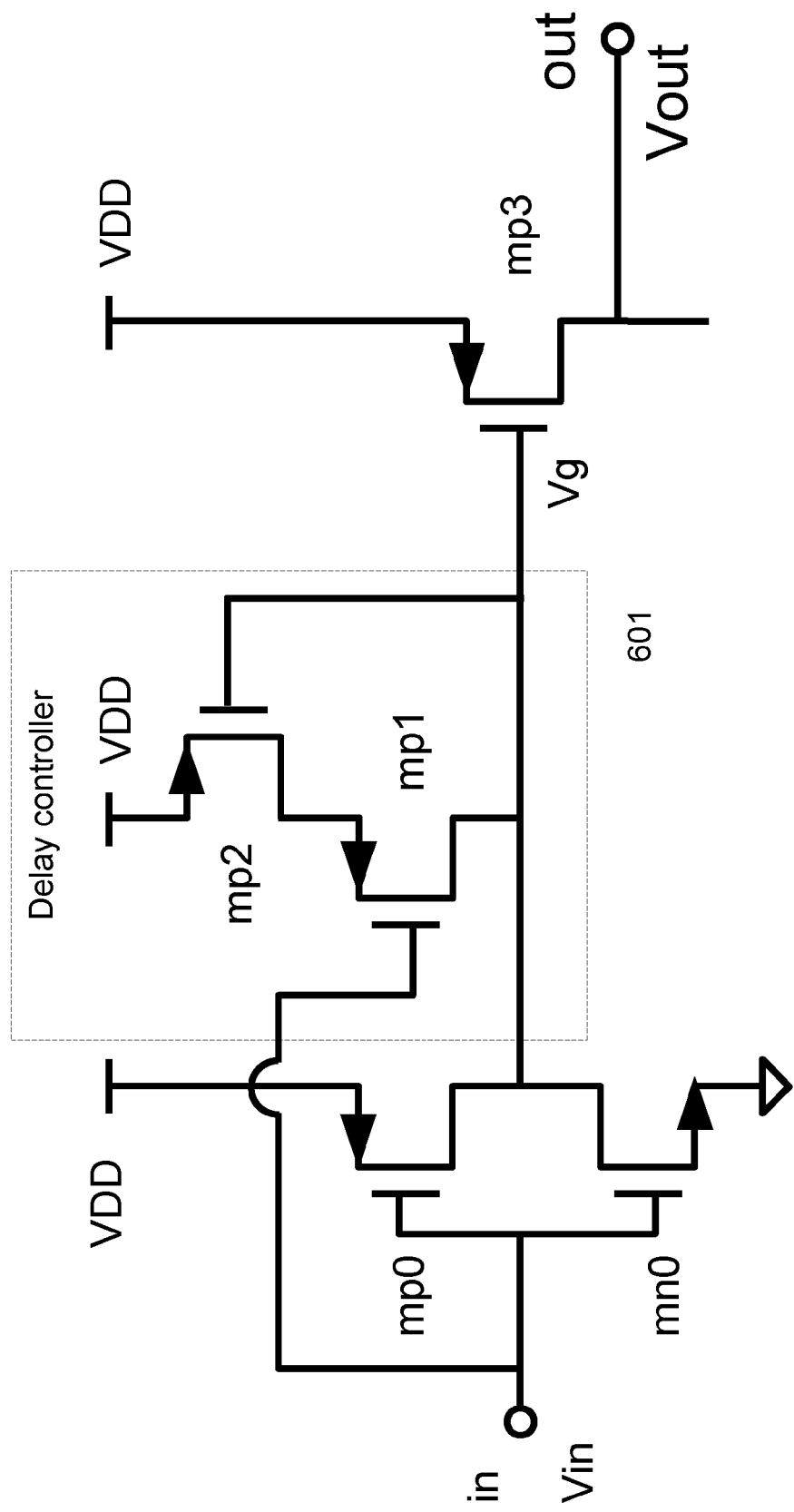
FIG. 6A illustrates a driver circuit for an output switch according to one embodiment of the present invention.
Figure 6B:
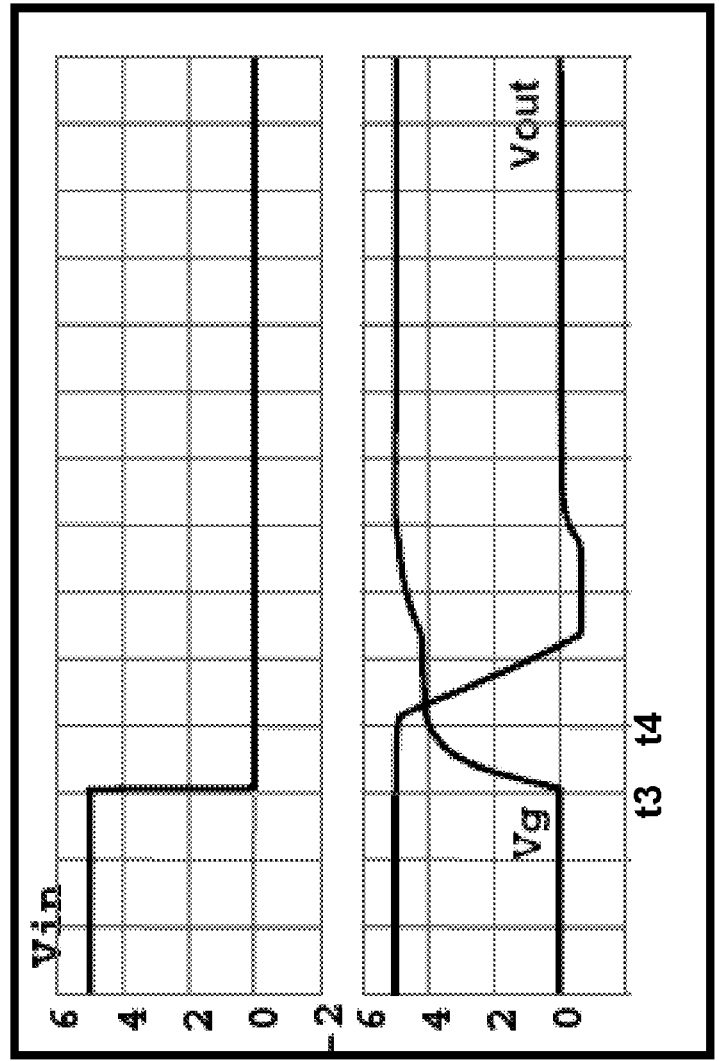
FIG. 6B illustrates waveforms of signals in the driver circuit of FIG. 6A according to one embodiment of the present invention.

FIG. 6A illustrates a driver circuit of an output switch according to another embodiment of the present invention, and FIG. 6B illustrates waveforms of signals in the circuit of FIG. 6A.

In FIG. 6A, the output switch may be a P-type FET mp3, and a delay controller 601 may comprise transistors mp1 and mp2. The gate of mp1 may be coupled to the input voltage $V_{in}$, the source of mp1 may be coupled to the drain of mp2, and the drain of mp1 may be coupled to the gate of mp3, respectively. The gate of mp2 may be coupled to the gate of mp3, the source of mp2 may be coupled to the voltage $V_{DD}$, and the drain of mp2 may be coupled to the source of mp1, respectively. Transistors mp2 and mp3 may be the same type of device, in this case P-type FETs, and may have approximately the same threshold voltage $V_{TH}$, so that they may become conductive and stop being conductive approximately simultaneously.

FIG. 6B illustrates waveforms of signals in the driver circuit of FIG. 6A during a process of turning off the output switch mp3. As shown, before time t3, the input voltage $V_{in}$ may be high, mn0 may be conductive, mp0 and mp1 may not be conductive, and $V_g \approx 0$. Thus, mp3 and mp2 may be conductive, and $V_{out} \approx V_{DD}$.

Around time t3, the input voltage $V_{in}$ may turn low, mn0 may stop being conductive when $V_{in}$ falls below its threshold voltage, and mp0 and mp1 may become conductive when $V_{in}$ reaches their threshold voltages respectively. When mp0 becomes conductive, it may push $V_g$ up. Before $V_g$ reaches the threshold voltage $V_{TH}$ of mp3 and mp2, both mp1 and mp2 are conductive, the circuit branch consisting of mp1 and mp2 may accelerate the push up effect applied to $V_g$. The resistance of mp1 and/or mp2 may be adjusted to accelerate the rise of $V_g$: the lower the total resistance of the circuit branch consisting of mp1 and mp2, the faster $V_g$ may be pushed up, the earlier mp3 may stop being conductive, and the earlier the transition of $V_{out}$ may start. Thus, this may help to reduce the propagation delay between the time of $V_{in}$ change and the time of $V_{out}$ transition.

Shortly after time t4, $V_g$ may exceed the threshold voltage $V_{TH}$ of mp3 and mp2. Transistors mp3 and mp2 may stop being conductive, and the $V_{out}$ transition, from high to low, may start.

In the circuit in FIG. 6A, when the output switch mp3 is not conductive, mp2 in the delay controller 601 is not conductive either, since they have similar $V_{TH}$ and their gates are coupled together. Accordingly, the delay controller 601 may be operative to push up $V_g$ only when both mp3 and mp2 are conductive, which is before the output transition, thus avoiding affecting the output transition change rate.

Figure 7:
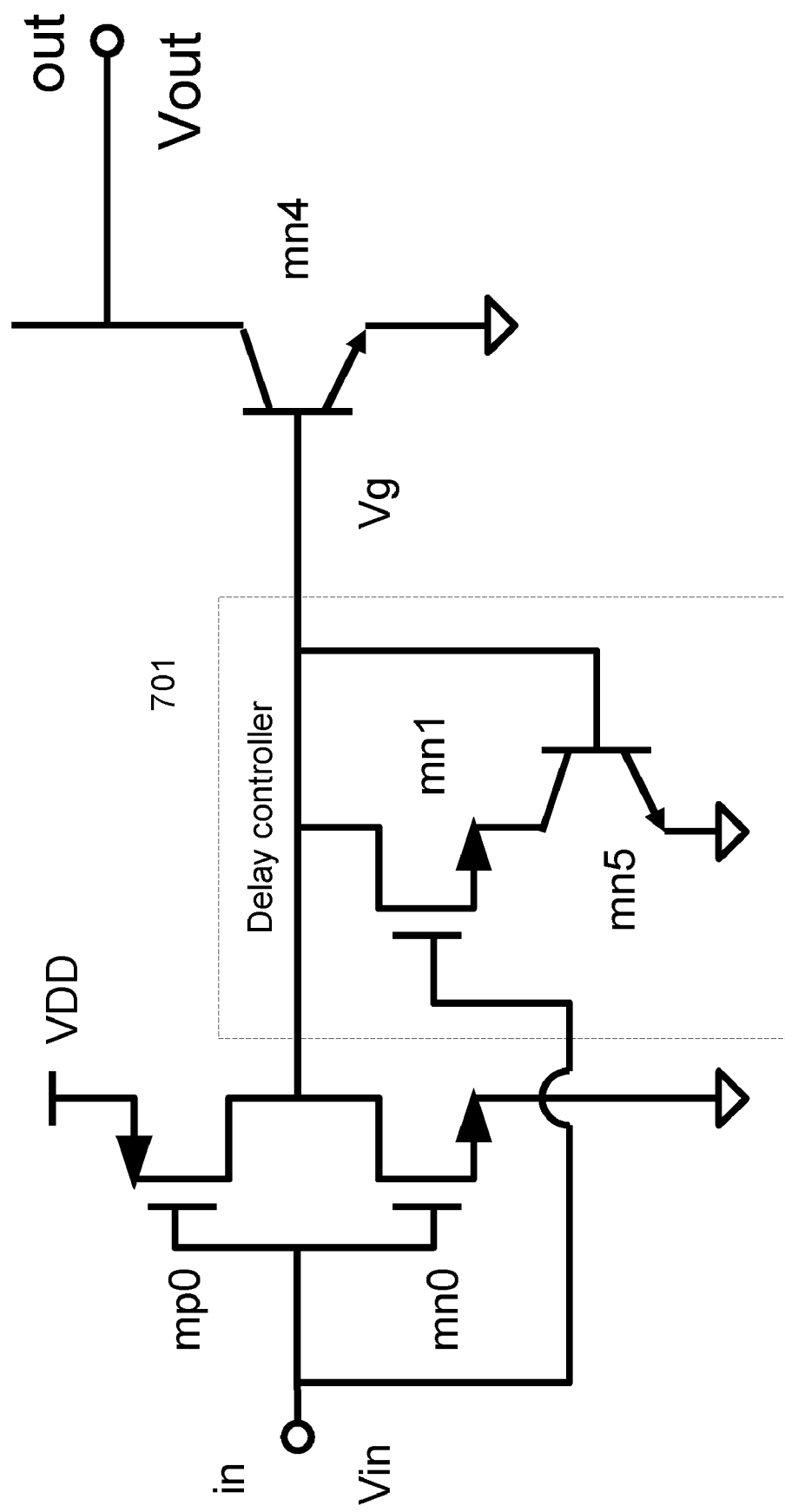
FIG. 7 illustrates a driver circuit for an output switch according to one embodiment of the present invention.

FIG. 7 illustrates a driver circuit of an output switch according to another embodiment of the present invention.

In FIG. 7, the output switch may be an N-type bipolar junction transistor (BJT) mn4, and a similar N-type BJT mn5 may be used to replace the transistor mn2 in the circuit shown in FIG. 4. Particularly, the base of the output switch mn4 may be coupled to the drains of mp0 and mn0, the emitter of mn4 may be grounded, and the output voltage $V_{out}$ may be obtained from the collector of mn4. The base of mn5 may be coupled to the base of mn4, the collector of mn5 may be coupled to the source of mn1, and the emitter of mn5 may be grounded.

The operation of the circuit shown in FIG. 7 may be similar to the circuit shown in FIG. 4. When $V_{in}$ is low, mp0 may be conductive, mn0 and mn1 may be not conductive, and $V_g \approx V_{DD}$. Transistors mn4 and mn5 may be conductive and $V_{out}$ may be low.

When $V_{in}$ changes from low to high and exceeds the threshold voltage of mp0, mp0 may stop being conductive. When $V_{in}$ reaches the threshold voltage of mn0, mn0 may become conductive and start to pull down $V_g$. When $V_{in}$ reaches the threshold voltage of mn1, mn1 may become conductive. Before $V_g$ drops below the threshold voltage of mn4 and mn5, both mn1 and mn5 are conductive, and the circuit branch consisting of mn1 and mn5 may help to accelerate the drop of $V_g$. Adjusting the resistance of mn1 may help to adjust the change rate of $V_g$, and accordingly the length of the propagation delay between the time of $V_{in}$ change and the time of $V_{out}$ transition.

When $V_g$ drops below the threshold voltage of mn4, mn4 and mn5 may stop being conductive and the transition of $V_{out}$ may start.

Since mn5 in the delay controller 701 may become conductive and stop being conductive approximately simultaneously with the output switch mn4, the delay controller 701 may be used to adjust the propagation delay independently of the output voltage transition rate.

Figure 8:
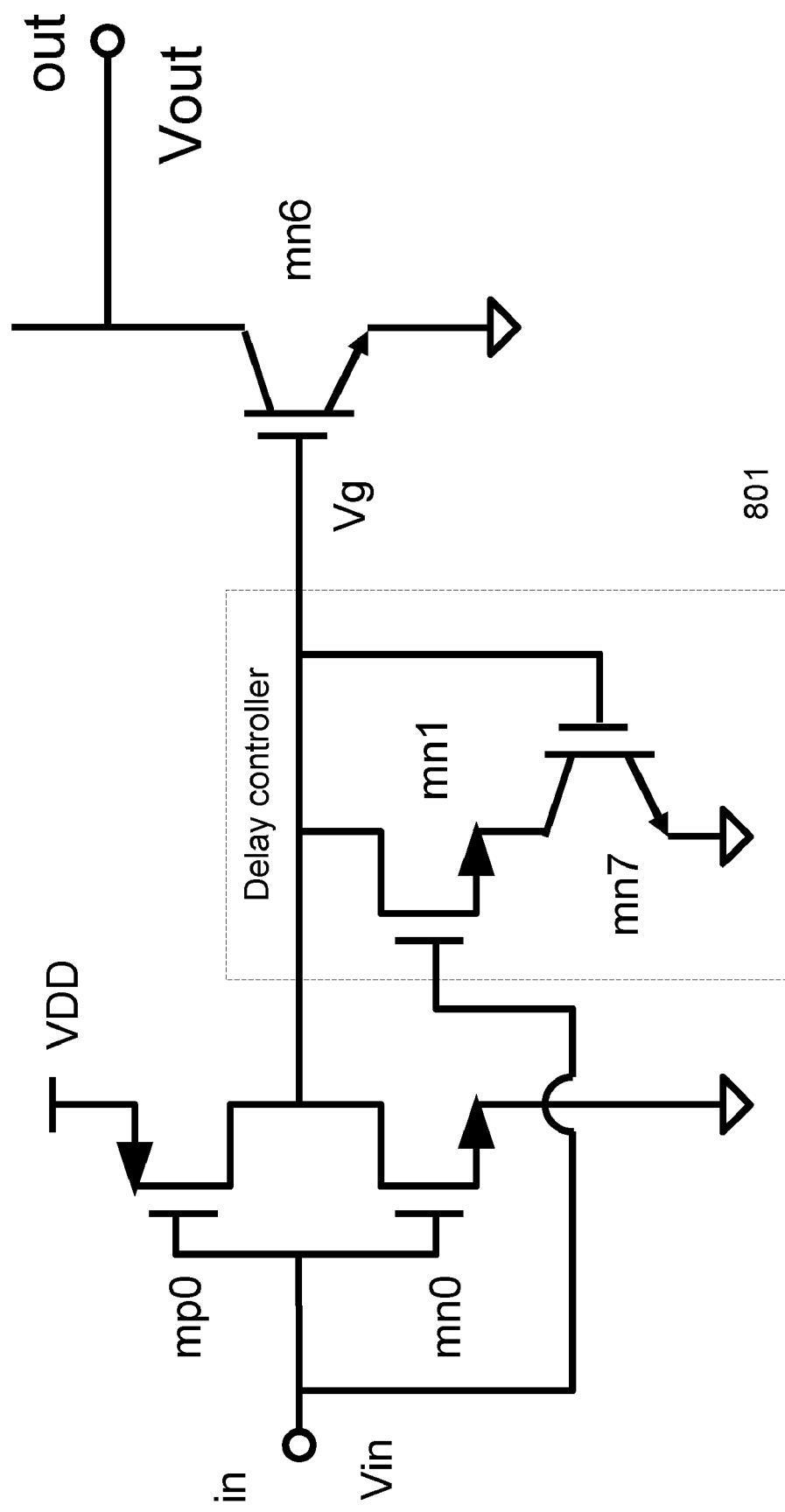
FIG. 8 illustrates a driver circuit for an output switch according to one embodiment of the present invention.

FIG. 8 illustrates a driver circuit of an output switch according to another embodiment of the present invention.

In FIG. 8, the output switch may be an N-type insulated gate bipolar transistor (IGBT) mn6, and a similar N-type IGBT mn7 may be used to replace the transistor mn2 in the circuit shown in FIG. 4. The operation of the circuit shown in FIG. 8 may be similar to the circuits shown in FIGS. 4 and 7. Transistors mn6 and mn7 may be similar devices and become conductive and stop being conductive approximately simultaneously.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. Therefore, it is intended that the invention be considered as limited only by the scope of the appended claims.

What is claimed is:

1. A circuit, comprising:
    an output switch coupled to a source potential at a first terminal and coupled to an output terminal of the circuit at a second terminal thereof;
    a driver circuit, having an input terminal and an output terminal, the output terminal electrically coupled to a control input of the output switch;
    a delay controller comprising a first transistor having a control input electrically coupled directly to the input terminal of the driver circuit, a drain electrically coupled directly to the control input of the output switch, and a source electrically coupled directly to a drain of a second transistor, the second transistor having a control input electrically coupled directly to the control input of the output switch and a source electrically coupled directly to the source potential.

2. The circuit of claim 1, wherein the delay controller responds to a predetermined input voltage at the control input of the first transistor by driving a control voltage on the control input of the output switch to the source potential.

3. The circuit of claim 1, wherein the delay controller responds to the predetermined input signal at the control input of the first transistor by initially driving the control voltage on the control input of the output switch at a first rate to the source potential, and slowing the driving to a second rate when the source potential is approximately equal to the threshold voltage of the output switch and the delay controller, wherein the second rate is slower than the first rate.

4. The circuit of claim 3, wherein the delay controller becomes conductive and stops being conductive to the source potential approximately simultaneously with the output switch.

5. The circuit of claim 3, wherein reducing the resistance of the delay controller first and second transistors shortens a time for driving the control input of the output switch to the source potential.

6. The circuit of claim 3, wherein the output switch is a transistor.

7. The circuit of claim 6, wherein the delay controller and the output switch have approximately the same threshold voltage.

8. The circuit of claim 6, wherein the output switch, the delay controller first transistor, and the delay controller second transistor are field-effect transistors (FETs) with similar transition properties.

9. The circuit of claim 6, wherein the output switch, the delay controller first transistor, and the delay controller second transistor are N-type FETs.

10. The circuit of claim 6, wherein the output switch, the delay controller first transistor, and the delay controller second transistor are P-type FETs.

11. The circuit of claim 6, wherein the output switch, the delay controller first transistor, and the delay controller second transistor are bipolar junction transistors (BJTs) with similar transition properties.

12. A circuit, comprising:
    a driver circuit for receiving an input voltage and turning on and off an output switch, the driver circuit having an input terminal and an output terminal, the output terminal electrically coupled directly to a control input of the output switch;
    a delay controller comprising a first transistor having a control input electrically coupled directly to the input terminal of the driver circuit, a drain electrically coupled directly to the control input of the output switch, and a source electrically coupled directly to a drain of a second transistor, the second transistor having a control input electrically coupled directly to the control input of the output switch and a source electrically coupled directly to the source potential; and
    wherein the delay controller operates to initially increase the rate of change of a control voltage on the control input of the output switch, and the delay controller being switched approximately simultaneously with the output switch to control a propagation delay between a transition in the input voltage and a transition in an output voltage at the output switch.

13. The circuit of claim 12, wherein the delay controller responds to the input voltage at the control input of the first transistor by driving the control voltage on the control input of the output switch to the source potential.

14. A circuit, comprising:
    a driver circuit having an input terminal and an output terminal, the output terminal electrically coupled directly to a control input of an output switch;
    a delay controller comprising a first transistor having a control input electrically coupled directly to the input terminal of the driver circuit, a drain electrically coupled directly to the control input of the output switch, and a source electrically coupled directly to a drain of a second transistor, the second transistor having a control input electrically coupled directly to the control input of the output switch and a source electrically coupled directly to the source potential; and wherein operation of the delay controller allows the delay controller to respond to an input signal at the control input of the first transistor by initially driving a control voltage on the control input of the output switch at a first rate to the source potential, and slowing the driving to a second rate when the control voltage is approximately equal to a threshold voltage of the output switch and the second transistor.

\* \* \* \* \*